United States Patent [19]

Iijima et al.

[11] Patent Number: 4,811,254
[45] Date of Patent: Mar. 7, 1989

[54] DISPLACEMENT DETECTOR FOR AN ENCODER

[75] Inventors: Kenzaburou Iijima; Yuoshinori Hayashi; Terumoto Nonaka; Akira Usui, all of Hamamatsu, Japan

[73] Assignee: Nippon Gakki Seizo Kabushiki Kaisha, Japan

[21] Appl. No.: 940,545

[22] Filed: Dec. 12, 1986

[30] Foreign Application Priority Data

Dec. 17, 1985 [JP] Japan .................................. 60-283643
Dec. 17, 1985 [JP] Japan .................................. 60-283644

[51] Int. Cl.$^4$ ............................................. G06F 15/36
[52] U.S. Cl. ........................................ 364/560; 341/6; 364/561
[58] Field of Search ............... 364/556, 560–562, 364/, 559, 565; 324/175, 165, 83 Q, 83 R, 229, 243; 329/124, 207; 375/81, 82, 120; 331/65; 33/125 W; 340/347 SY, 347 P; 341/6, 15, 1; 318/661

[56] References Cited

U.S. PATENT DOCUMENTS

| | | | |
|---|---|---|---|
| 2,947,929 | 8/1960 | Bower | 33/1 PT |
| 3,914,760 | 10/1975 | Logue | 340/347 AD |
| 3,984,831 | 10/1976 | Jones et al. | 340/347 SY |
| 4,138,729 | 2/1979 | Bayer et al. | 340/347 SY |
| 4,370,642 | 1/1983 | Costello et al. | 340/347 SY |
| 4,449,117 | 5/1984 | Fortescue | 340/347 SY |
| 4,472,669 | 9/1984 | Denham et al. | 340/347 SY |
| 4,486,845 | 12/1984 | Duckworth | 364/559 |
| 4,506,228 | 3/1985 | Kammeyer | 375/82 |
| 4,527,120 | 7/1985 | Kurosawa | 340/347 SY |
| 4,583,079 | 4/1986 | Simon | 340/347 SY |
| 4,618,940 | 10/1986 | Schmitt | 364/560 |
| 4,644,485 | 2/1987 | Ferber et al. | 364/525 |
| 4,654,636 | 3/1987 | Rusk | 324/175 |

OTHER PUBLICATIONS

Furtney, Jr., Digital Phase-Locked Loop, IBM Technical Disclosure Bulletin, vol. 17, No. 7, Dec. 1974, pp. 1884–1886.

Primary Examiner—Parshotam S. Lall
Assistant Examiner—S. A. Melnick
Attorney, Agent, or Firm—Ostrolenk, Faber, Gerb & Soffen

[57] ABSTRACT

An absolute displacement detector utilizing two sensors and a code bearing track having domains arranged such that relative movement between the sensors and the track produces two signals in phase quadrature which are processed with digital circuitry to provide displacement data indicated by a multiple bit digital word whose higher bits indicate number of domains passed and whose lower bits indicate position within a domain.

8 Claims, 3 Drawing Sheets

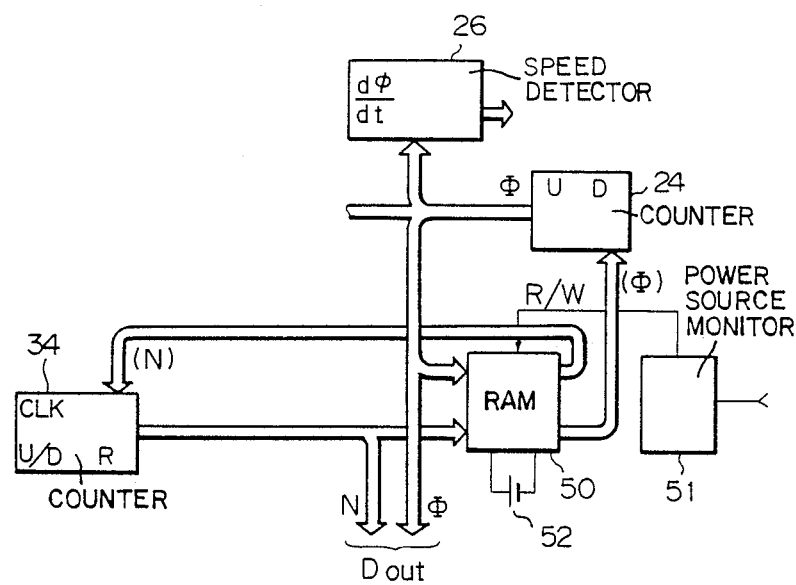
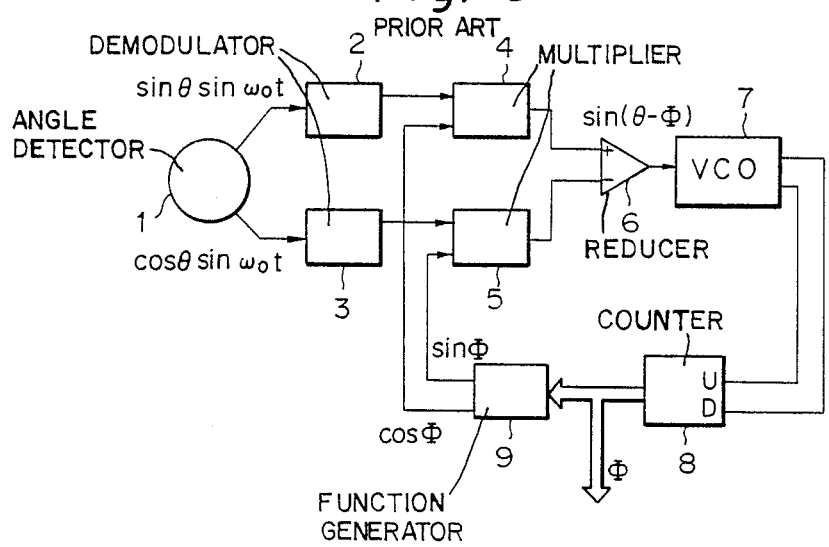

DISPLACEMENT DETECTOR FOR AN ENCODER

BACKGROUND OF THE INVENTION

The present invention relates to an improved displacement detector for an encoder which is well suited for detection of linear or angular displacement.

One typical circuit for converting analog angular signals into corresponding digital signals includes an angle detector which is made up of a synchro control and a Scott-connected transformer. When a carrier wave signal $\sin\omega_0 t$ is supplied to the rotor of the synchro control transformer, its stator generates a synchronizing signal corresponding to the rotation angle $\theta$ of the rotor. When this synchronizing signal is supplied to the primary side of the Scott-connected transformer, the secondary side of the transformer generates analog signals $\sin\theta.\sin\omega_0 t$ and $\cos\theta.\sin\omega_0 t$ which are passed to respective demodulators. The demodulators remove the carrier wave components, i.e. $\sin\omega_0 t$, from the analog signals to issue angle signals $\sin\theta$ and $\cos\theta$ which are applied to respective analog multipliers. Output signals from the mutlipliers are applied to a common reducer which issues a difference signal $\sin(\theta-\Phi)$. The difference signal $\sin(\theta-\Phi)$ is passed to an up-down counter via a voltage control oscillator. The count value $\Phi$ of this counter is applied to a function generator which then, depending on the count value $\Phi$ of the counter, issues sine and consine signals ($\sin\Phi$ and $\cos\Phi$). These signals are passed to the above-described analog multipliers for multiplication purposes.

With this system, the analog multipliers issue output signals $\sin\theta.\cos\Phi$ and $\cos\theta.\sin\Phi$ and the output signal of the reducer is given by the following equation:

$$\sin\theta.\cos\Phi - \cos\theta.\sin\Phi = \sin(\theta - \Phi)$$

according to the trigometric identiy $\sin(A\pm B) = \sin A.\cos B \pm \cos A.\sin B$.

As a result, the output signal from the voltage control oscillator has a frequency corresponding to the value of $\sin(\theta-\Phi)$. Since the output signal $\Phi$ of the up-down counter changes depending on the value of $\sin(\theta-\Phi)$, the system operates as a sort of phase-locked loop which makes the value of $\sin(\theta-\Phi)$ be zero, i.e. makes $\theta$ equal to $\Phi$. When $\Phi$ includes about 10 bits (i.e. when the output of the counter is about 10 bits), the system has a degree of resolution sufficient to divide the angular range of 0 to $2\pi$ into 1024 sections.

With this conventional displacement detector, most signals are processed in analog form and, as a consequence, the use of many analog circuit elements limits the ability to form an integrated system. Presently, even a hybrid integrated circuit has a dimension of about $50\times 50$ mm. In addition, variations in temperature of the voltage control oscillator and/or power source voltage tend to cause drift, thereby lowering reliability of the detection.

SUMMARY OF THE PRESENT INVENTION

It is the object of the present invention to raise the degree of integration and degree of resolution of a displacement detector with minimized influence on the drift of the detector.

In accordance with the present invention, the displacement detector for an encoder that is provided with a scale track having a detectable characteristic which varies substantially as a function of a sine wave along the direction of said track, said detector comprising:

first and second sensors arranged closely facing and movable relative to said track, said sensors generating signals which vary as a function of said detectable characteristic as said sensors move relative to said track, and being spaced apart by a phase lag of $\frac{1}{4}\lambda$ when $\lambda$ is the wavelength of said sine wave;

first and second A/D converters for digitalizing said signals generated by said first and second sensors, respectively;

a function generating and multiplying unit for generating (1) the product of multiplication of the output signal of said first A/D converter with a cosine value corresponding to prescribed data, and (2) the product of multiplication of the output signal of said second A/D converter with a sine value corresponding to said prescribed data;

a reducer for generating a difference signal indicative of the difference between said products of multiplication;

a counting unit which performs counting as a function of said diffierence signal, shifts its mode of counting depending on the polarity of said difference signal, and generating a count signal as a function of its count, said count signal being applied to said function generating and multiplying unit; and means for detecting the number of said domains passed by one of said first and second sensors depending on square pulses which are obtained by wave shape discrimination of said level signals from said first and second sensors;

said function generating and multiplying unit, said reducer and said counting unit formng a phase-locked loop; and output signals from said counting unit and said detecting means defining lower bits and higher bits, respectively, of an absolute displacement data signal which is indicative of the relative movement of said track and said sensors.

BRIEF DESCRIPTION OF THE DRAWINGS

FIG. 5 is a block diagram of a conventional displacement detector.

DESCRIPTION OF THE PREFERRED EMBODIMENTS

Figure 1:
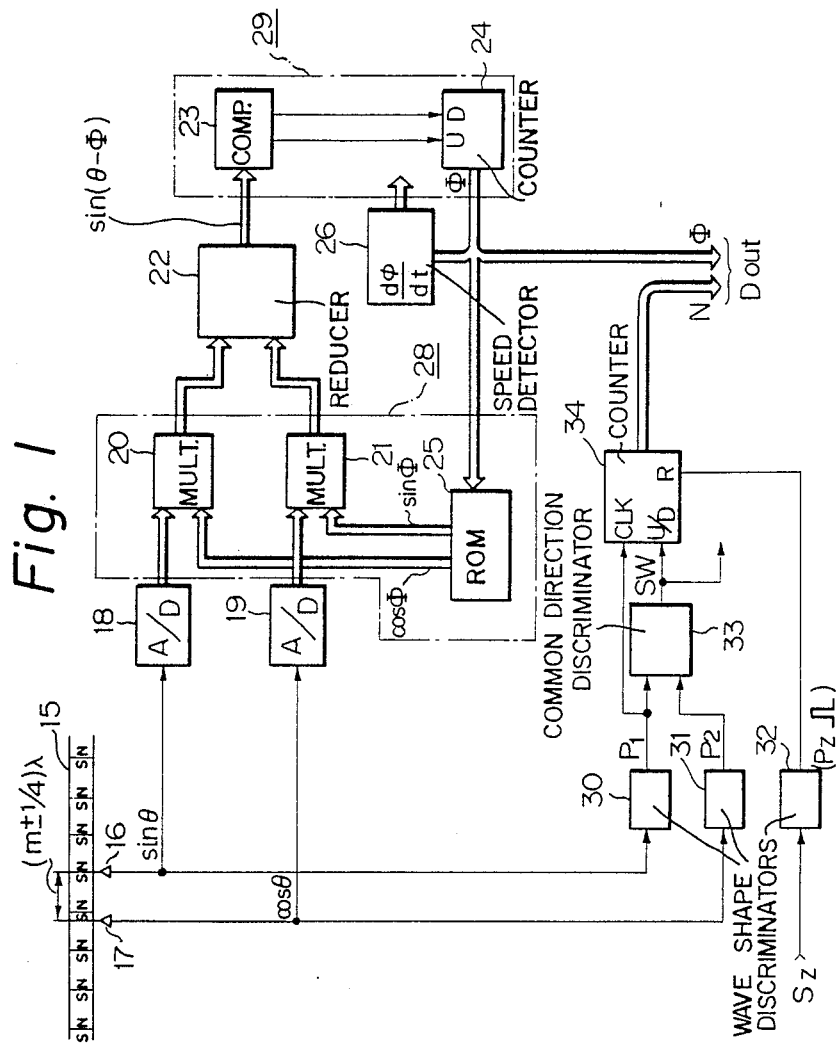
FIG. 1 is a block diagram of the basic embodiment of the displacement detector in accordance with the present invention.

One embodiment of the displacement detector in accordance with the present invention is shown in FIG. 1, in which a scale 15 is in general formed by magnetizing a prescribed track with a sine wave having a constant period (e.g., the intensity and polarity of the magnetic field on the track vary in a generally sinusoidal manner). In the present embodiment, a circular track is provided on the surface of a circular disc of a magnetic material. The wave length $\lambda$ of the sine wave used for the magnetization is set in a range from several tens to several hundreds $\mu$m. Magnetic sensors 16 and 17 are arranged facing the scale 15 in order to generate signals whose levels correspond to the intensity of the magnetization on the scale 15. Semiconductor elements are preferably used for the magnetic sensors 16 and 17 so that their product signals will not include carrier waves. The magnetic sensor 17 is displaced relative to the magnetic sensor 16 by a distance corresponding to $\frac{1}{4}\lambda$ whereby the output of sensor 17 has a phase lag of $\frac{1}{4}\lambda$ (90°) with respect to the output of the magnetic sensor 16. More particularly, the distance between the two magnetic sensors 16 and 17 is equal to $(m+\frac{1}{4})\lambda$, wherein m is a positive integer. The scale 15 on the one hand and the magnetic sensors 16, 17 on the other are arranged for movement relative to one another. Due to the foregoing phase shift, when the output signal from the magnetic sensor 16 takes the form of a sine wave, the output signal from the magnetic sensor 17 takes the form of a cosine wave. As a result, when the interval of one period of the magnetizing sine wave, i.e. the distance between adjacent poles of the scale, is $\theta = 0 \sim 2\pi$, the output signals from the magnetic sensors 16 and 17 are given in the form of $\sin\theta$ and $\cos\theta$, respectively.

The magnetic sensors 16 and 17 are connected to A/D converters 18 and 19 which convert the output signals $\sin\theta$ and $\cos\theta$ into digitalized $\sin\theta$ and $\cos\theta$ signals, respectively. The digitalized $\sin\theta$ and $\cos\theta$ signals are applied to a common reducer 22 via respective multipliers 20 and 21. The reducer 22 generates an output signal indicative of the difference between the outputs of multipliers 20 and 21 and applies this signal to a digital comparator 23. When the output generated by reducer 22 is positive, the digital comparator 23 applies a pulse to the count up input of counter 24. Counter 24 has a resolution of 8 to 10 bits. When the output of reducer 22 is negative the comparator 23 applies a pulse to the count down input of counter 24. The counter 24 applies a count value $\Phi$ to a function generating ROM 25 (read only memory) which generates sine data and cosine data corresponding to the countvalue $\Phi$. Data of $\sin\Phi$ and $\cos\Phi$ are stored in the function generating ROM 25 in order to be read out in accordance with count value $\Phi$ from the counter 24. The data of $\cos\Phi$ are applied to the multiplier 20 whereas the data of $\sin\Phi$ are applied to the multiplier 21. With this construction, the output signal from the reducer 22 is equal to $\sin(\theta-\Phi)$. The comparator 23 applies a pulse to the count rp input of counter 24 when $\sin(\theta-\Phi)$ is positive and applies a pulse to the countdown input of counter 24 when $\sin(\theta-\Phi)$ is negative. As a result, the count value $\Phi$ of the counter 24 changes depending on the value of $\sin(\theta-\Phi)$ and is indicative of the relative position of the scale 15 and the sensors 16, 17 within the distance between two adjacent poles of the magnetically stored sine wave. The multipliers 20, 21 and the function generating ROM 25 form a function generating and multiplying unit 28 whereas the comparator 23 and the counter 24 form a counting unit 29. Further, the count value $\Phi$ from the counter 24 is applied to a speed detector 26 which differentiates the count value in counter 24. The operation of the speed detector 26 will be explained in more detail below.

Figure 2:
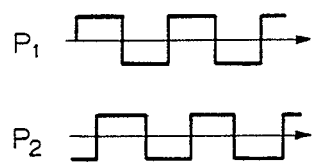
FIG. 2 is a wave shape diagram of signals processed through the system shown in FIG. 1, FIGS. 3 and 4 are block diagrams of modified embodiment of the displacement detector in accordance with the present invention.

The output signals from the magnetic sensors 16 and 17 are also applied to wave shape discriminators 30 and 31, respectively. The wave shape discriminator 30 compares the output of detector 16 with a prescribed threshold value and, generates a binary signal $P_1$ whose level H or L depends on the size of the output signal. In the same way, the wave shape discriminator 31 issues a binary signal $P_2$ as a function of the output of detector 17. As shown in FIG. 2, the binary signals $P_1$ and $P_2$ take the form of square wave having a phase lag of $\pi/2$. When the magnetic sensors 16 and 17 move in the positive direction relative to scale 15, the pulse $P_1$ is ahead of pulse $P_2$. When the magnetic sensors 16 and 17 move in the negative direction relative to scale 15, the pulse $P_2$ is ahead of pulse $P_1$.

The wave shape discriminators 30 and 31 are connected to a common direction discriminator 33 which discriminates the direction of movement of the magnetic sensors 16 and 17 relative to scale 15. For example, discrimination is carried out by examining the level of the pulse $P_2$ at the moment of rise of the pulse $P_1$. The output signal Sw is passed to the up-down shifting terminal U/D of a counter 34 and to a position outside the system. The counter 34 shifts between the up- and down-modes while counting the pulses $P_1$ from the wave shape discriminator 30. In the case of this embodiment, the positive direction of movement of the magnetic sensors 16 and 17 relative to scale 15 causes up-mode counting and the negative direction of movement causes down-mode counting. Every time the magnetic sensors 16 and 17 have performed one complete circulation relative to the scale 15, the zero-point signal Sz issued at the reference position is converted to a zero-point pulse Pz after passage through a wave shape discriminator 32, which is then applied to the reset terminal R of the counter 34. As a consequence, the count value of the counter 34 varies as a function of the instantaneous positions of the magnetic sensors 16 and 17 relative to the reference position (zero position), and corresponds to the number of the magnetic domains (the number of magnetic poles) which the magnetic sensors 16 and 17 have passed by in a given revolution of sensors 16, 17 relative to scale 15.

The output signal N of the counter 34 and the output signal $\Phi$ of the counter 24 are issued outside the system as absolute displacement data Dout. The output signal N of the counter 34 forms a higher bit of the externally issued displacement data Dout while the output signal $\Phi$ from the counter 24 forms a lower bit thereof.

The displacement detector in FIG. 1 operates as follows.

First, assuming that the magnetic sensors 16 and 17 move in the positive direction relative to scale 15, the count in counter 34 is increased by one every time the magnetic sensors 16 and 17 have passed one magnetic domain on the scale 15 and the resultant count values N are applied sequentially to form the higher bits of the absolute displacement data Dout. From observation of the higher bits of the absolute displacement data Dout, one can learn how many magnetic domains have been passed by the magnetic sensors 16 and 17, i.e. how distant the magnetic sensors 16 and 17 are from the reference position.

The output signals $\sin\theta$ and $\cos\theta$ are digitalized by the A/D converters 18 and 19 and multiplied by the output signals $\cos\Phi$ and $\sin\Phi$ from the function generating ROM 25, respectively. In response to the results of these multiplications, the reducer 22 generates the signal $\sin(\theta-\Phi)$. When the signal $\sin(\theta-\Phi)$ is positive, the count value $\Phi$ in the counter 24 increases. When the signal $\sin(\theta-\Phi)$ is negative the count value $\Phi$ decreases. The output signals $\cos\Phi$ and $\sin\Phi$ change in accordance with changes in the count value $\Phi$. Thus the circuit in FIG. 1 operates as a sort of phase-locked loop which operates to make $\sin(\theta-\Phi)$ be equal to zero, i.e. to make $\theta$ equal to $\Phi$. As a result, the count value $\Phi$ indicates the position of the magnetic sensor 16 within a given magnetic domain on the scale 15. For this reason, the sequential count values Φ from the counter 24 are used as the lower bits of the absolute displacement data Dout. Since the counter 24 includes 8 to 10 bits, the degree of resolution of the position within a magnetic domain is in a range from 1/256~1/2048.

The operation of the speed detector 26 will now be explained in detail. As noted above, the system tries to force the value Φ to be equal to θ. As a result, the count value Φ changes as a function of to the relative speed of the magnetic sensors 16 and 17. In other words, the rate of change in the count value (dΦ/dt) corresponds to the relative speed of the magnetic sensors 16 and 17 relative to scale 15 and the output signal generated by the speed detector 26 represents a speed signal. The moving direction of the magnetic sensors 16 and 17 is indicated by the polarity of this speed signal.

In accordance with the present invention, the system is constructed so that, except for the output signals sinθ and cosθ from the magnetic sensors 16 and 17, only digital signals are processed throughout the system. As a consequence, there is a significant reduction in number of analog circuit elements and a high degree of integration on a monolithic semiconductor substrate is possible. In a test production conducted by the inventors, a highly integrated circuit could be encased in a flat package 5×7×1 mm. In the case of a conventional hybrid integrated circuit having a similar function, a package of 50×50×10 mm is needed. The drifts of the system caused by temperature change (−20° to +80° C.) and voltage change (±20%) were compared with those of the conventional one shown in FIG. 5. The conventional system presented ±2 bits drifts in response to the temperature and voltage changes. Under the same conditions, the system of the present invention presented ±1 bit drifts only. In accordance with the present invention, the lowest bit of the absolute displacement data Dout corresponds to the lowest bit of the data indicating a finest position within a certain magnetic domain and, consequently, the drift yields only very small influence on the correct operation of the system.

In the conventional system shown in FIG. 5, output signals sinθ.sinω₀t and cosθ.sinω₀t of an angle detector 1 are passed to demodulators 2 and 3 and output signals of the demodulators 2 and 3 are passed to a common reducer (difference amplifier) 6 after multiplication by multipliers 4 and 5, respectively. The output signal sin(θ−Φ) of the reducer 6 is passed to a counter 8 via a voltage control oscillator (VCO) 7 and each count value Φ from the counter 8 is passed to a function generator 9 which thereof generates output signal cosΦ and sinΦ for multiplication at the multipliers 4 and 5.

Figure 3:
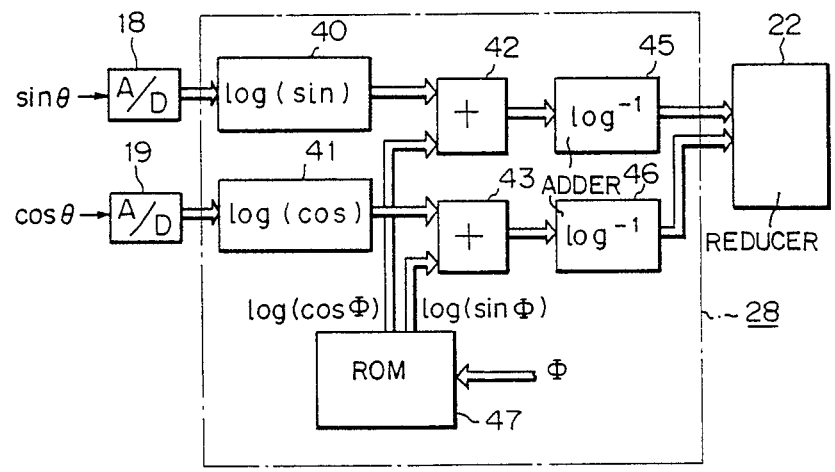

Another embodiment of the displacement detector in accordance with the present invention is shown in FIG. 3, in which a modified function generating and multiplying unit 28 is used for processing logarithmic signals. The system includes logarithm tables 40 and 41 which store logarithmic values of sine and cosine over the angle range of 0 to 2π. Upon receipt of the data gnerated by the A/D converters 18 and 19, the logarithm tables 40 and 41 generate corresponding logarithmic values of sine and cosine to adders 42 and 43. A function generating ROM 47 is provided to generate output signals log(cosΦ) and log (sinΦ) on receipt of the count value Φ from the counter 24 (see FIG. 1). The output signal log (cosΦ) is passed to the adder 42 whereas the output signal log(sinΦ) is passed to the adder 43. Results of addition at the adders 42 and 43 are passed to counter logarithm circuits 45 and 46 in order to obtain their counter logarithmic values. The counter logarithm circuits 45 and 46 generate output signals sinθ.cosΦ and cosθ.sinΦ, respectively. On receipt of these output signals, the reducer 22 generates an output signal sin(θ−Φ) as in the case of the system shown in FIG. 1.

Instead of the circular track employed in the foregoing embodiments, a linear track can also be used in the present invention. Further, instead of the magnetic encoder, the present invention may be used with optical encoders.

As is clear from the foregoing description, the present invention assures high degree of integration on a monolithic semiconductor substrate, high degree of dissolution in displacement detection and reduced influence of drift to be caused by change in voltage and/or temperature. In practical use of the displacement detector, however, it is preferable that the result of detection should be obtained upon activation of the power source. The embodiment of the present invention shown in FIG. 4 achieves this result. Here, processing of the output signals Φ and N from the counters 24 and 34 is somewhat modified from that in FIG. 1.

More specifically, a non-volatile static RAM 50 accompanied with a battery 52 is connected to a power source monitor 51 which detects the moment of activation and deactivation of the power source. The power source monitor 51 generates a read signal R when the power source is activated, and a write signal W when the power source is deactivated, both signals being passed to the static RAM 50. On receipt of a write signal W, the static RAM 50 stores the count values Φ and N from the counters 24 and 34. On receipt of a read signal R, the static RAM 50 applies the stored count values (Φ) and (N) to the preset data input terminals of the counters 24 and 34, respectively.

This embodiment operates as follows. When the entire system has ceased its operation and the power source is deactivated, the power source monitor 51 passes a write signal W to the static RAM 50 at the moment of deactivation and the static RAM 50 stores the count values Φ and N which correspond to the displacement of the magnetic sensors 16 and 17 at this very moment. When the power source is again activated to initiate the operation of the entire system, the power source monitor 51 passes a read signal R to the static RAM 50 which thereupon supplies the stored count values (Φ) and (N) to preset data input terminals of the counters 24 and 34, respectively. Then the initial values of the counters 24 and 34 become the preceding values, respectively. As a result, the absolute displacement data Dout corresponds to the displacement of the magnetic sensors 16 and 17 at the very moment of activation of the power source. Thus the result of detection can be obtained upon activation of the power source.

We claim:

1. An improved displacement detector for an encoder which is provided with a track having a detectable characteristic which varies substantially as a function of a sine wave along the direction of said track, said detector comprising:

first and second sensors arranged closely facing and movable relative to said track, said sensors generating signals which vary as a function of said detectable characteristic as said sensors move relative to said track, said spaces being spaced apart by a phase lag of ¼λ wherein λ is the wavelength of said sine wave;

first and second A/D converters for digitalizing said signals generated by said first and second sensors, respectively;

a function generating and multiplying unit for generating (1) the product of multiplication of the output signal of said first A/D converter with a cosine value corresponding to prescribed data, and (2) the product of multiplication of the output signal of said second A/D converter with a sine value corresponding to said prescribed data;

a reducer for generating a difference signal indicative of the difference between said products of multiplication;

a counting unit which performs counting as a function of said difference signal, shifts its mode of counting depending on the polarity of said difference signal, and generates a count signal as a function of its count, said count signal being applied to said function generating and multiplying unit; and means for detecting the number of said domains passed by one of said first and second sensors depending on square pulses which are obtained by wave shape discrimination of said level signals from said first and second sensors;

said function generating and multiplying unit, said reducer and said counting unit forming a phase-locked loop; and output signals from said counting unit and said detecting means defining lower bits and higher bits, respectively, of an absolute displacement data signal which is indicative of the relative movement of said track and said sensors.

2. An improved displacement detector according to claim 1 in which said counting unit includes a preset data input terminal, said detecting means includes a preset data input terminal; and said detector further comprises non-volatile data storing means for storing output data from said counting unit and said detecting means upon deactivation of a power source normally supplying power to said detector and supplies stored data to said preset data terminals of said counting unit and said detecting means when said power source is reactivated.

3. An improved displacement detector according to claim 1 or 2 in which said output signal from said counting unit forms the lower bits of said absolute displacement data and said output signal from said detecting means forms the higher bits of said absolute displacement data.

4. An improved displacement detector as claimed in claim 1 or 2 in which said function generating and multiplying unit includes multipliers connected to said A/D converters, and a function generating ROM connected, on the input side, to said counting unit and, on the output side, to said multipliers.

5. An improved displacement detector according to claim 1 or 2 in which said counting unit includes a comparator connected to said reducer, and a first counter connected, on the input side, to said comparator and, on the output side, to said function generating and multiplying unit.

6. An improved displacement detector according to claim 1 or 2 in which said detecting means includes wave shape discriminators connected to said sensors, a direction discriminator connected to said wave shape discriminators and a second counter connected on the input side to said direction discriminator.

7. An improved displacement detector according to claim 1 or 2 in which said sensors are magnetic sensors.

8. An improved displacement detector according to claim 1 or 2 in which said sensors are photoelectric sensors.

* * * * *